United States Patent
Yang et al.

(10) Patent No.: US 9,626,996 B2
(45) Date of Patent: Apr. 18, 2017

(54) BLOCK COPOLYMER SELF-ASSEMBLY FOR PATTERN DENSITY MULTIPLICATION AND RECTIFICATION

(71) Applicant: Seagate Technology LLC, Cupertino, CA (US)

(72) Inventors: XiaoMin Yang, Livermore, CA (US); Zhaoning Yu, Palo Alto, CA (US); Kim Yang Lee, Fremont, CA (US); Michael Feldbaum, San Jose, CA (US); Yautzong Hsu, Fremont, CA (US); Wei Hu, Newark, CA (US); Shuaigang Xiao, Fremont, CA (US); Henry Yang, San Jose, CA (US); HongYing Wang, Fremont, CA (US); Rene Johannes Marinus van de Veerdonk, Pleasanton, CA (US); David Kuo, Palo Alto, CA (US)

(73) Assignee: Seagate Technologies LLC, Cupertino, CA (US)

( * ) Notice: Subject to any disclaimer, the term of this patent is extended or adjusted under 35 U.S.C. 154(b) by 190 days.

(21) Appl. No.: 14/588,865

(22) Filed: Jan. 2, 2015

(65) Prior Publication Data
US 2015/0118625 A1    Apr. 30, 2015

Related U.S. Application Data

(62) Division of application No. 12/979,658, filed on Dec. 28, 2010, now abandoned.

(51) Int. Cl.
*G03F 7/004*     (2006.01)
*G11B 5/855*     (2006.01)
(Continued)

(52) U.S. Cl.
CPC .............. *G11B 5/855* (2013.01); *B05D 1/005* (2013.01); *B32B 3/30* (2013.01); *B32B 27/283* (2013.01);
(Continued)

(58) Field of Classification Search
CPC .... G03F 7/0002; G03F 7/0035; G03F 7/2059; G03F 7/40; G03F 7/165; G03F 7/2022;
(Continued)

(56) References Cited

U.S. PATENT DOCUMENTS

2009/0196488 A1* 8/2009 Nealey ................ B81C 1/00031
382/145
2010/0294146 A1* 11/2010 Fragala ..................... G06K 1/12
101/28

(Continued)

OTHER PUBLICATIONS

Park et al, "Double textured cylindrical block copolymer domains via directional solidification on a topographically patterned substrate", Appl. Phys. Lett. 2001, 79(6), p. 848-850.

*Primary Examiner* — Amanda C Walke

(57) ABSTRACT

Provided herein is a method, including a) transferring an initial pattern of an initial template to a substrate; b) performing block copolymer self-assembly over the substrate with a density multiplication factor k; c) creating a subsequent pattern in a subsequent template with the density multiplication factor k; and d) repeating steps a)-c) with the subsequent template as the initial template until a design specification for the subsequent pattern with respect to pattern density and pattern resolution is met.

19 Claims, 2 Drawing Sheets

(51) Int. Cl.

| | | |
|---|---|---|
| *H01L 21/3065* | (2006.01) | |
| *G03F 7/40* | (2006.01) | |
| *H01L 21/027* | (2006.01) | |
| *G03F 7/20* | (2006.01) | |
| *H01L 21/02* | (2006.01) | |
| *B82Y 10/00* | (2011.01) | |
| *B82Y 40/00* | (2011.01) | |
| *G03F 7/00* | (2006.01) | |
| *B81C 1/00* | (2006.01) | |
| *B32B 27/36* | (2006.01) | |
| *B32B 27/28* | (2006.01) | |
| *B32B 27/30* | (2006.01) | |
| *B32B 3/30* | (2006.01) | |
| *G03F 7/16* | (2006.01) | |
| *B05D 1/00* | (2006.01) | |
| *C23F 4/00* | (2006.01) | |

(52) U.S. Cl.
CPC .......... *B32B 27/302* (2013.01); *B32B 27/308* (2013.01); *B32B 27/36* (2013.01); *B81C 1/00031* (2013.01); *B82Y 10/00* (2013.01); *B82Y 40/00* (2013.01); *C23F 4/00* (2013.01); *G03F 7/0002* (2013.01); *G03F 7/0035* (2013.01); *G03F 7/165* (2013.01); *G03F 7/203* (2013.01); *G03F 7/2022* (2013.01); *G03F 7/2059* (2013.01); *G03F 7/40* (2013.01); *H01L 21/0274* (2013.01); *H01L 21/02112* (2013.01); *H01L 21/3065* (2013.01); *B32B 2457/14* (2013.01); *B81C 2201/0149* (2013.01); *Y10T 428/24612* (2015.01)

(58) Field of Classification Search
CPC .......... H01L 21/0274; H01L 21/02112; H01L 21/3065; H01L 21/0392; B82Y 10/00; B82Y 40/00
USPC .... 430/270.1, 311, 313, 314, 317, 322, 325, 430/329, 330, 331, 296, 323; 438/700, 438/689, 71, 699, 781; 216/47, 51
See application file for complete search history.

(56) References Cited

U.S. PATENT DOCUMENTS

| | | | |
|---|---|---|---|
| 2012/0107583 A1* | 5/2012 | Xiao | G03F 7/0002 428/210 |
| 2012/0135159 A1 | 5/2012 | Xiao et al. | |
| 2014/0224764 A1* | 8/2014 | Schmid | H01L 21/0337 216/41 |
| 2014/0335324 A1* | 11/2014 | Kim | B44C 1/227 428/195.1 |
| 2015/0010869 A1* | 1/2015 | Peeters | G03F 7/038 430/322 |
| 2015/0064630 A1* | 3/2015 | Wuister | C08L 53/00 430/322 |
| 2015/0380252 A1* | 12/2015 | Xu | H01L 21/28123 438/703 |
| 2016/0210397 A1* | 7/2016 | Laenens | G03F 1/36 |

* cited by examiner

BLOCK COPOLYMER SELF-ASSEMBLY FOR PATTERN DENSITY MULTIPLICATION AND RECTIFICATION

CROSS REFERENCE

This application is a division of U.S. patent application Ser. No. 12/979,658, filed Dec. 28, 2010.

FIELD

The present disclosure relates generally to imprint template fabrication and repair.

BACKGROUND

In fabricating media for hard disk drives ("HDD"), bit patterned media ("BPM") are used in the storage industry because of their high storage capacity. The storage capacity of BPM depends on the density of the magnetic islands, or "bits" on the media substrate surface. As such, research in the area of BPM fabrication has mainly been devoted to creating consistent and uniform patterns of bits on a BPM substrate.

As the resolution and pattern density of the BPM increases, an issue may arise regarding how to correct imperfections in the BPM template, such as missing and connected bits. Cr lift-off is another problem encountered in high-density BPM template fabrication.

Accordingly, there is a need in the art for BPM templates having high density patterns, and methods for fabricating them, particularly for those BPM having a density greater than 1 Tdpsi. There is also a need for methods of fabricating BPM templates using a combination of lithography and self-assembly techniques.

SUMMARY

In one aspect of the disclosure, a method includes forming a first pattern on a first substrate, transferring the pattern from the first substrate to a second substrate to form a patterned second substrate, and performing block copolymer self-assembly on the patterned second substrate.

In another aspect of the disclosure, an apparatus is manufactured by a method. The method includes forming a first pattern on a first substrate, transferring the first pattern from the first substrate to a second substrate, and performing block copolymer self-assembly on the second substrate having the first pattern thereon, forming a second pattern.

In a further aspect of the disclosure, an apparatus includes a patterned substrate having a pattern density of at least about 1 Tdpsi.

DETAILED DESCRIPTION

Figure 1:
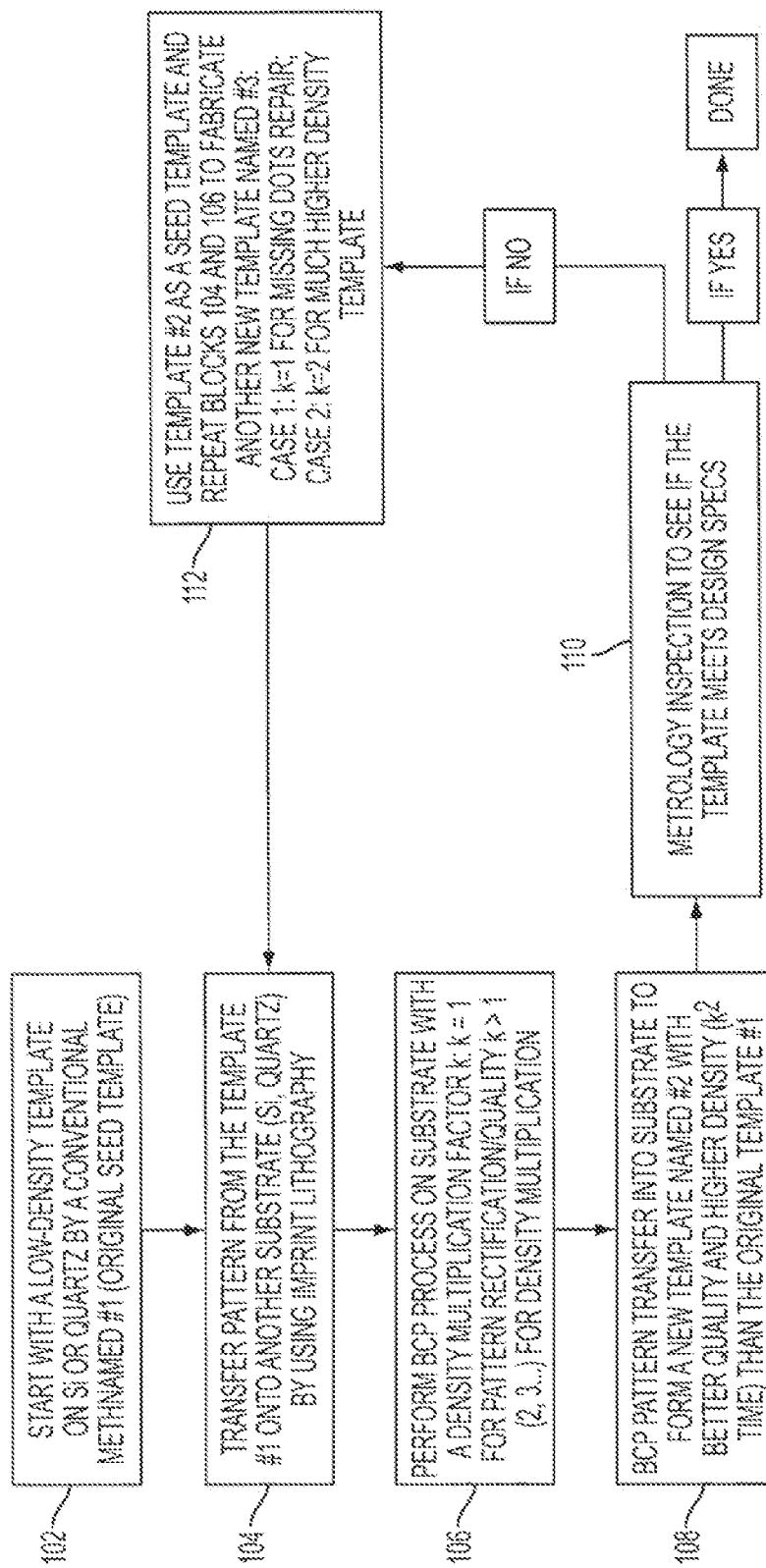
FIG. 1 is a flow chart depicting an example of a process flow for fabricating a patterned apparatus.

Various concepts are described more fully hereinafter with reference to the accompanying drawings. These concepts, however, may be embodied in many different forms and should not be construed as being limited by any specific structure or process presented in this disclosure. Rather, the specific details presented throughout this disclosure are provided so that the disclosure will be thorough and complete, and will fully convey the scope of these concepts to those skilled in the art. However, it will be apparent to those skilled in the art that the various concepts presented in this disclosure may be practiced without these specific details. In some instances, well-known aspects of the disclosure may be shown in block diagram form in order to avoid obscuring the various concepts presented throughout this disclosure.

Various apparatuses having high resolution patterns, such as Bit-Patterned Media (BPM) templates, semiconductors, and photonic devices will be presented, as well as methods for achieving high resolution patterns using a combination of patterning and self-assembly techniques. Various methods for integrating patterning techniques with block copolymers may be used to create nanopatterns, which may have a bit density greater than 1 Tdpsi. The various apparatuses produced using these methods may exhibit optimized pattern density, optimized pattern accuracy, or both, when compared to apparatuses produced using other methods. In some cases, pattern densities may be achieved using these methods that are from about 1.1 to about 10 times more dense than apparatuses produced using other systems and methods, where pattern density is measured in dots per square inch (dpsi). In other cases, pattern accuracy may be achieved using these methods that are from about 1.1 to about 10 times more accurate than apparatuses produced using others methods, where pattern accuracy is measured in defects per square inch.

Various methods are presented in this disclosure for integrating patterning techniques with self-assembly techniques in order to create apparatuses, such as a BPM template, a semiconductor, or a photonic device. A patterned BPM template substrate may then be used as a master template for direct fabrication of other patterned media, including daughter templates and BPM.

In order to meet the demands of BPM and DTR media manufacturing, additional specifications may be addressed beyond pattern resolution. Methods incorporating self-assembly, such as block copolymer self-assembly, may provide high resolution and acceptable throughput levels, while providing greater reliability, fewer defects in long-range ordering, all without being dependent on e-beam lithography. This may be advantageous because lithography techniques, such as e-beam lithography, typically use lower throughput in order to achieve large areas of dense patterning at acceptable resolutions.

The methods may be used to form a patterned substrate by conducting lithography to form a pattern on a substrate, and conducting block-copolymer self-assembly to provide higher resolution and greater accuracy to the pattern. The methods may be used to form a pattern on all or a portion of the substrate.

The methods may be performed by lithography techniques in which a mask layer is deposited on the substrate; and a first pattern is formed on the substrate. Some methods further provide a chemical affinity layer on the substrate before conducting block-copolymer self-assembly techniques. The block-copolymer self-assembly comprises coating the substrate with a block copolymer, removing one block from the block copolymer, and transferring the pattern from the remaining block of the block copolymer to the substrate.

Various aspects of these methods are illustrated in FIG. 1, which is a flow diagram depicting a method for patterning a substrate using lithography and BCP deposition. The methods are further described below.

In block 102, a first substrate is patterned, for example, by using lithography techniques. The first substrate may be a silicon or quartz template, or any other substrate suitable for use as a BPM template. The patterning technique may be selected from techniques such as optical lithography (e.g., DUV), advanced lithography (e.g., e-beam lithography, EUV, or imprint lithography), or any other patterning techniques known to those skilled in the art.

In block 104, the pattern formed in block 102 is transferred from the first substrate to a second substrate. The second substrate may be a silicon or quartz template, or any other substrate suitable for use as a BPM template. The transfer may be carried out using lithography techniques, such as imprint lithography (e.g., UV imprint lithography).

In blocks 106 and 108, a BCP self-assembly process is performed on the second substrate to provide increased pattern density and/or optimized pattern quality (e.g., by replacing missing dots in the pattern, and/or reducing the number of imperfect dots) by using a multiplication factor k. When k=1, pattern rectification is provided. When k>1 (e.g., k=2 such that 2×2=4), density multiplication is provided (e.g., 250 Gdpsi×4=1 Tdpsi). The BCP self-assembly process may be carried out as shown in FIG. 2, as further described below.

Figure 2A:
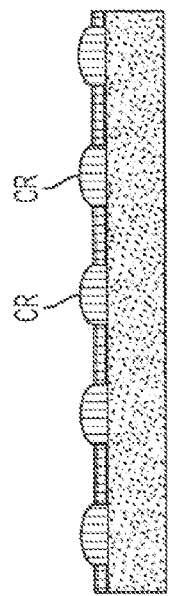
FIGS. 2A-2G are schematic diagrams depicting an example of a process flow including a BCP self-assembly process.

In FIG. 2A, pre-pattern marks are imprinted on the substrate using a resist pattern from a low density template (e.g., a 250 Gbpsi template). The resist pattern guides the application of the BCP film. The imprinted resist pattern may have a thickness ranging from about 5 nm to about 50 nm, preferably from about 5 nm to about 20 nm, and more preferably from about 10 nm to about 20 nm. After the resist pattern is imprinted on the substrate, an optional descumming process may be performed.

Figure 2B:
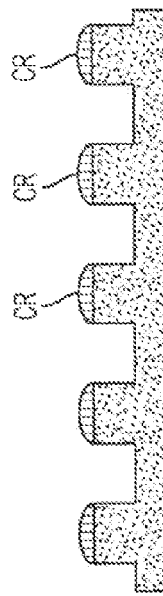

In FIG. 2B, a BCP film is provided on the imprinted substrate, and may be annealed. The BCP film may be applied by any suitable technique, including spin coating. Annealing may be conducted by carrying out thermal annealing, for from about 30 minutes to about 24 hours, at a temperature of from about 165° C. to about 220° C. When a lower temperature is used, annealing may be carried out for a longer time; conversely, when a higher temperature is used, annealing may be carried out for a shorter time. The annealing process may be used to promote self-assembly of the BCP, which may be further facilitated by the addition of an optional chemical affinity layer, such as a polystyrene brush layer such as a hydroxy terminated polystyrene, including mono-hydroxyl-terminated polystyrene, hydroxy terminated poly(4-t-butyl styrene) and diphenylmethyl-ol terminated polystyrene. The polystyrene brush layer may also comprise a neutral polymer that promotes BCP self assembly. The BCP film may range in thickness from about 30 to about 70 nm.

The BCP used for the film may be any BCP. Examples of BCP, include, but are not limited to, BCP that is used in the methods is comprised of at least two constituent units, structural units, or "blocks," herein termed "block A" and "block B." Use of the singular "block A" or "block B" also includes use of plural "blocks A" and "blocks B." Block A and block B may be organic or inorganic, or block A may be organic, and block B inorganic, or block A may be inorganic and block B organic. Preferably, block A and block B are immiscible. The block copolymer formed by block A and block B is preferably named using the convention polyA-block-polyB.

The block copolymers used in the methods may be selected from polystyrene-block-polymethylmethacrylate (PS-b-PMMA), polystyrene-block-poly2-vinylpyridine, polystyrene-block-poly4-vinylpyridine, polystyrene-block-polyethyleneoxide, polystyrene-block-polyisoprene, polystyrene-block-butadiene, polystyrene-block-polydimethylsiloxane (PS-b-PDMS), polyisoprene-block-polydimethylsiloxane, polymethylmethacrylate-block-polydimethylsiloxane, polyisobutylene-block-polydimethylsiloxane, or polystyrene-block-polyferrocenylsilane. A person of ordinary skill in the art will appreciate that the methods described herein may be varied depending upon the chemical characteristics of the BCP selected. One will appreciate that selection of the BCP may also depend upon the target pattern to be created using the BCP. For example, the topographical pattern left by the imprinting blocks described below may determine the chosen BCP, since certain BCP blocks may correlate better with certain topographical pattern features and pattern dimensions. One preferred block copolymer is PS-b-PMMA, although one skilled in the art will appreciate that other BCPs may be used depending on the predetermined pattern.

Figure 2C:
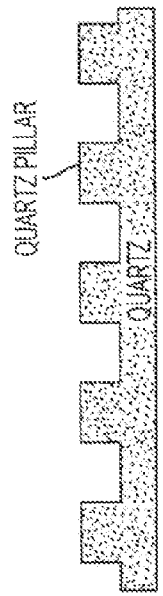

In FIG. 2C, one of the blocks of the BCP is removed, and the film comprising the remaining block of the block copolymer may be descummed, if necessary, to prepare the film for mask deposition. The block may be removed by a chemical process, such as by exposing the film to UV light, followed by a wet process using acetic acid. Alternatively, the block may be removed by an $O_2$ dry etching process. If descumming is performed, it may be carried out using, for example, $O_2$ dry descumming, $O_2$+ argon descumming, or $CO_2$ reactive ion beam aging (RIBE) descumming. When performed, descumming may also remove contaminants from the substrate.

Figure 2D:
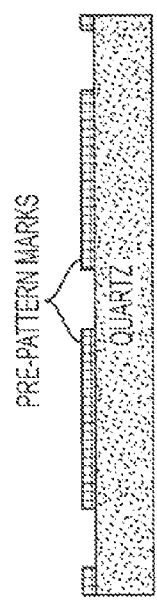

In FIG. 2D, a mask layer is deposited on the film comprising the remaining block of the block copolymer. The mask layer may be a hard mask layer, such as a chromium layer (Cr), a tantalum layer (Ta), a carbon layer (C), or an aluminum layer (Al). The mask layer may be from about 3 nm to about 10 nm thick, preferably from about 4 nm to about 8 nm thick, and more preferably from about 5 to about 6 nm thick.

Figure 2E:
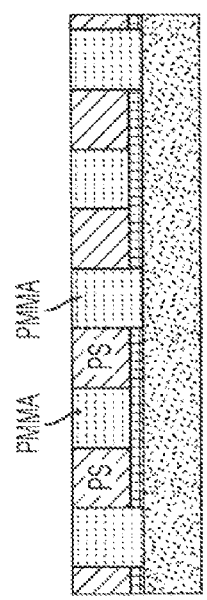

In FIG. 2E, a dry lift-off of the mask layer is performed as follows: (1) The top layer of the mask (e.g., Cr) is first removed. This may be performed, for example, by an RIE process using $Cl_2$ gas. (2) The mask layer deposited on the sidewalls formed during the mask deposition process is then removed by using high-angle ion milling, which may be carried out at 70° C. using an inert gas, such as argon. (3) The remaining block of the block copolymer is finally removed from the substrate. This may be performed, for example, by using an $O_2$ dry RIE etching process.

Figure 2F:
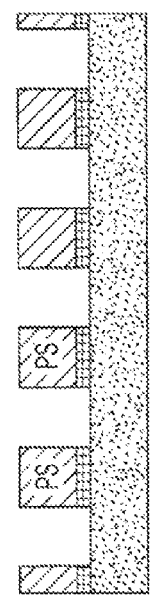

In FIG. 2F, the resulting pattern is transferred to the substrate, for example, by etching. A RIE dry etching process may be used.

Figure 2G:
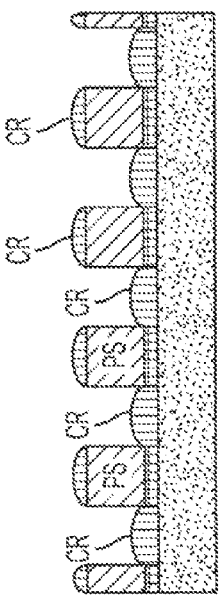

In FIG. 2G any residual mask is removed. The mask may be removed using a wet process, such as by using a Cr etchant, and then the etched template may optionally be cleaned.

Referring again to FIG. 1, in block 110, following completion of the BCP process and pattern transfer, the second substrate may be inspected to determine if the pattern quality and density specifications are met. If yes, then the process is complete. If not, then the process can proceed to block 112.

In block 112, the pattern may optionally be transferred from second substrate to a third substrate using imprint lithography as described above in block 104, and a BCP self-assembly process may optionally be performed on the third substrate, as described above in blocks 106 and 108. The process of repeating the pattern transfer and block copolymer self assembly process may be repeated multiple times in order to provide optimized pattern density, optimized pattern accuracy, or both.

One will appreciate that the processes illustrated in FIGS. 1 and 2 and described herein may vary according to the needs and uses of the predetermined template. The method may provide optimized quality to nanostructures by increasing pattern density and/or improving pattern quality (e.g., replacing missing dots, correcting deformed and/or joined dots). The optimized pattern density and/or optimized pattern quality may be provided by repeating the blocks of transferring the pattern from one substrate to a new substrate, and performing BCP self-assembly on the new substrate onto which the pattern was transferred. These blocks of transferring the pattern to a new substrate and conducting BCP self-assembly techniques may be repeated once, twice, or as many times as necessary to achieve a particular predetermined density and/or pattern quality level. The method may also reduce or eliminate the problem of lift-off of the mask layer through use of the dry lift-off process described in FIG. 2E.

The substrate patterning methods incorporating BCP self-assembly techniques may be used to fabricate templates, increase the density of patterns provided on templates, and/or to repair defects in patterns provided on templates.

The methods described herein are not limited to BPM-related applications. In principle, they can be used for many other applications in which high-resolution patterns are desirable, particularly periodic dot or line patterns.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method, comprising:
   a) lithographically transferring an initial pattern of an initial template to a substrate;
   b) applying a layer of block copolymer to the substrate after the transferring of the initial pattern, and performing block copolymer self-assembly of the layer of block copolymer with a density multiplication factor k;
   c) creating a subsequent pattern by removing a block from the layer of block copolymer after self-assembly for a subsequent template with the density multiplication factor k;
   d) determining whether or not the subsequent pattern meets a design specification; and
   e) repeating steps a)-d) with the subsequent template as the initial template until the subsequent pattern meets the design specification.

2. The method of claim 1, wherein the design specification comprises a pattern density specification and a pattern quality specification with respect to missing pattern features and deformed pattern features.

3. The method of claim 1, wherein removing the block comprises
   exposing the layer of block copolymer to ultraviolet light followed by acetic acid or
   dry etching the layer of block copolymer with oxygen.

4. The method of claim 3, further comprising:
   depositing a mask over the substrate and another block of the layer of block copolymer,
   wherein the mask comprises chromium, tantalum, aluminum, or carbon, and
   wherein the mask has a thickness ranging from about 3 nm to about 10 nm.

5. The method of claim 4, further comprising:
   removing the mask from the another block by reactive ion etching with chlorine, and
   removing the mask from sidewalls of the another block by high-angle ion milling.

6. The method of claim 5, further comprising:
   removing the another block of the annealed block copolymer film,
   wherein removing the another block comprises a dry etching process with oxygen.

7. A method, comprising:
   performing block copolymer self-assembly over a substrate with a density multiplication factor k, wherein the substrate includes an initial pattern;
   creating a subsequent pattern for a subsequent template with the density multiplication factor k;
   determining whether the subsequent pattern meets a design specification with respect to pattern density and pattern quality;
   if the subsequent pattern does not meet the design specification, performing another block copolymer self-assembly over the subsequent template with the density multiplication factor k, wherein the subsequent template includes the subsequent pattern;
   creating another subsequent pattern for another subsequent template with the density multiplication factor k; and
   determining whether the another subsequent pattern meets the design specification with respect to the pattern density and the pattern quality.

8. The method of claim 7, further comprising
   spin-coating a block copolymer film over the substrate.

9. The method of claim 8,
   wherein a block copolymer of the block copolymer film is selected from the group consisting of polystyrene-block-poly(methyl methacrylate), polystyrene-block-poly(2-vinylpyridine), polystyrene-block-poly(4-vinylpyridine), polystyrene-block-poly(ethylene oxide), polystyrene-block-polyisoprene, polystyrene-block-polybutadiene, polystyrene-block-poly(dimethylsiloxane), polyisoprene-block-poly(dimethylsiloxane), polyisobutylene-block-poly(dimethylsiloxane), poly (methyl methacrylate)-block-poly(dimethylsiloxane), and polystyrene-block-poly(ferrocenylsilane).

10. The method of claim 8, wherein the annealed block copolymer film has a thickness ranging from about 30 nm to about 70 nm.

11. A method, comprising:
performing a block copolymer self-assembly of an initial template by annealing a block copolymer film over an initial resist pattern on a substrate with a density multiplication factor k;
creating a subsequent pattern for a subsequent template with the density multiplication factor k; and
repeating the performing and the creating with the subsequent template as the initial template until a design specification for the subsequent pattern with respect to pattern density and pattern resolution is met.

12. The method of claim 11, further comprising:
creating the initial resist pattern using deep ultraviolet lithography, extreme ultraviolet lithography, electron-beam lithography, imprint lithography, or a combination thereof.

13. The method of claim 12, wherein the initial resist pattern is about 250 Gdpsi.

14. The method of claim 11, further comprising:
removing a first block of the block copolymer film subsequent to the annealing, and
depositing a mask over the substrate and a second block of the block copolymer film.

15. The method of claim 14, further comprising:
removing the mask over the second block, and
removing the second block,
wherein the removing the mask and the removing the second block comprises dry lift-off processes.

16. The method of claim 11, further comprising:
inspecting the subsequent pattern prior to the repeating to determine whether or not the subsequent pattern meets the design specification.

17. The method of claim 11,
wherein k=1 for pattern rectification, and
wherein k≥2 for pattern density multiplication.

18. The method of claim 11,
wherein k=1 for pattern rectification, and
wherein k≥3 for pattern density multiplication.

19. The method of claim 11,
wherein the initial resist pattern is about 250 Gdpsi,
wherein k≥2 for pattern density multiplication, and
wherein the subsequent pattern is about 1 Tdpsi.

* * * * *